United States Patent [19]
Leddige et al.

[11] Patent Number: 6,111,205
[45] Date of Patent: Aug. 29, 2000

[54] VIA PAD GEOMETRY SUPPORTING UNIFORM TRANSMISSION LINE STRUCTURES

[75] Inventors: Michael Leddige, Beaverton; John Sprietsma, Hillsboro, both of Oreg.

[73] Assignee: Intel Corporation, Santa Clara, Calif.

[21] Appl. No.: 08/959,244

[22] Filed: Oct. 28, 1997

[51] Int. Cl.[7] ...................................................... H05K 1/14

[52] U.S. Cl. .............................. 174/260; 174/261; 333/1; 361/777; 361/783; 439/61

[58] Field of Search ..................................... 174/254, 260, 174/261, 51; 257/728, 786; 333/246, 247, 1, 12; 361/783, 777, 803, 818; 439/59, 61, 607

[56] References Cited

U.S. PATENT DOCUMENTS

| | | | |
|---|---|---|---|
| 3,033,914 | 5/1962 | Acosta-Lieras | 174/254 |
| 3,398,232 | 8/1968 | Hoffman | 174/254 |
| 5,272,600 | 12/1993 | Carey | 361/803 X |
| 5,764,489 | 6/1998 | Leigh et al. | 361/777 |

*Primary Examiner*—Hyung-Sub Sough
*Attorney, Agent, or Firm*—Leo V. Novakoski

[57] ABSTRACT

A connector for coupling high frequency signals between devices includes a substrate having an array of vias for coupling a reference voltage to reference voltage traces that extend along the substrate surface between the devices. Signal traces including device pads for coupling signals to and from the devices alternate with the reference voltage traces. The widths of the reference voltage traces are varied to maintain a substantially constant separation between the reference voltage trace and an adjacent signal trace.

17 Claims, 7 Drawing Sheets

VIA PAD GEOMETRY SUPPORTING UNIFORM TRANSMISSION LINE STRUCTURES

BACKGROUND OF THE INVENTION

1. Technical Field

This invention relates to the field of electrical interconnects, and in particular to electrical interconnects for high frequency signals.

2. Background Art

The core operating frequencies of microprocessors have been increasing steadily, and it is expected that processors operating in the gigahertz (GHz) frequency regime will soon be available. In order to take full advantage of the speed of these microprocessors, computer systems must be able to couple data to and from the microprocessor core at ever increasing rates. The data transfer rate is typically increased by increasing the frequency at which signals are driven onto the traces that couple data between the processor and associated devices such as memory modules. As this frequency increases, interference effects become significant. In particular, high frequency signals are reflected by variations in the impedance of a trace, degrading the quality of the signal being transmitted. These impedance variations are attributable, in part, to variations in the capacitive coupling between adjacent traces.

Interference is particularly significant in the relatively long signal traces that couple data between, for example, a processor and a memory device on a circuit board. Reference traces are often interposed between the signal traces to reduce the capacitive coupling between signal traces. Reference voltages are provided to the reference traces by one or more voltage planes that are located within the circuit board and coupled to the traces through vias. These vias typically have large diameters relative to the signal and reference traces because it is difficult to manufacture circuit boards with small diameter vias. Relatively large via diameters are employed to improve the yields of circuit boards.

Signal and reference traces are often arrayed in relatively close packed configurations to accommodate timing constraints imposed by high speed signals. To reduce signal transit time, signal lines are routed between devices using the most direct path available. Device sizes are minimized for the same reason. The small device size reduces the spacing between device pads which couple the device to the signal traces. In such closely packed configurations, the relatively large via diameters can obstruct the most direct path between the devices, forcing the signal traces to be routed around the vias. In addition, device pads that couple signal traces to the device(s) intrude into the spacing between signal and reference traces. These factors alter the separation between the signal and reference traces, altering the capacitive coupling between adjacent traces. The resulting variation in the impedance of the signal trace increases the signal degradation due to interference effects.

These impedance variations and the consequent interference arise, for example, with memory devices such as those designed by Rambus Corporation of Mountain View, Calif. In a typical configuration, 100 MHz signals are coupled between a high speed Rambus DRAM (RDRAM) module on a circuit board and a memory controller associated with a processor. The timing constraints, including those imposed by the form factors (size) of the RDRAM cells, require closely arrayed signal and reference traces. The signal traces must be routed around vias and coupled to device pads, altering the trace impedance and generating interference-induced noise on the signal traces.

There is thus a need for a connector that is suitable for coupling high frequency signals on tightly configured signal traces with reduced signal degradation.

SUMMARY OF THE INVENTION

The present invention is a connector for high speed signals that allows signal traces to be tightly configured with reference traces and their associated via structures without significantly degrading the quality of signals transmitted through the signal traces. The signal traces, reference traces, and via structures are configured to maintain a substantially constant impedance along each of the signal traces.

In accordance with the present invention, a connector for coupling high frequency signals between devices includes an array of via pads on a substrate. Each via pad is coupled to a reference trace to form a reference structure that extends between the devices. Signal traces alternate with the reference structures in a configuration that maintains a substantially constant separation between each signal trace and its adjacent reference structure(s).

In one embodiment of the invention, the widths of the reference structures vary to provide a substantially constant distance between each signal trace and a reference structure adjacent to the signal trace.

BRIEF SUMMARY OF THE DRAWINGS

The present invention is illustrated by way of example in the following drawings in which like references indicate similar elements. These drawings disclose various embodiments of the invention for purposes of illustration only and are not intended to limit the scope of the invention.

DETAILED DISCUSSION OF THE INVENTION

The following description sets forth numerous specific details to provide a thorough understanding of the invention. However, those of ordinary skill in the art having the benefit of this disclosure will appreciate that the invention may be practiced without these specific details. In other instances, well known methods, procedures, components, and circuits have not been described in detail in order to more clearly highlight the features of the present invention.

The present invention is described with reference to memory devices, such as those designed by Rambus Corporation of Mountain View, Calif., and the coupling of these devices to a memory controller associated with a microprocessor or similar device. It is understood that the present invention may be employed advantageously wherever spatial and timing constraints require routing high frequency signals in closely spaced configurations.

Interference effects, such as those noted above, are becoming prevalent at the system level, where memory and other devices are forced to operate at increasingly higher frequencies. For example, data signals are transmitted over relatively long traces between a central processing unit (CPU) and associated devices mounted on a circuit board. The length of the traces imposes strict timing constraints on the signals, and these signals are routed as directly as possible between the coupled devices to meet the timing constraints.

The number of devices needing rapid access to the CPU places a premium on board space close to the CPU's interfaces and restricts the space available for routing a given set of lines. In addition, high speed devices, such as high speed DRAMs provided by Rambus corporation ("RDRAMs"), are designed to be compact to minimize signal transit time. The small device size limits the space between its connectors, keeping the signal traces closely spaced. The net effect of these considerations is that signal traces are configured in closely packed arrays. The combination of close packed signal traces and high frequency signals creates capacitive coupling problems that can significantly degrade signal bandwidth and quality.

Figure 1:
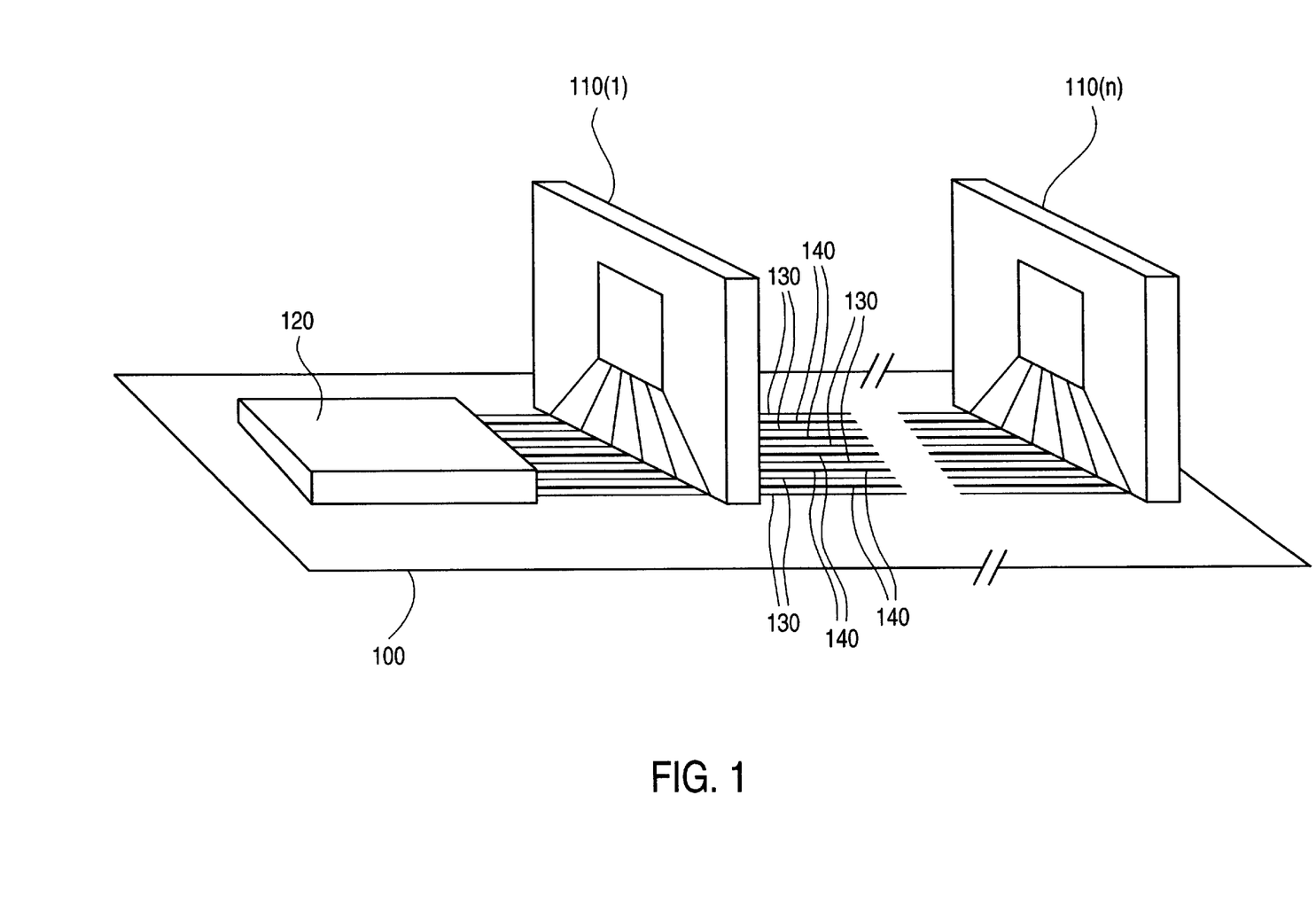
FIG. 1 is a perspective view of a circuit board including an array of memory cells coupled to a memory controller.

Referring first to FIG. 1, there is shown a circuit board 100 on which memory devices 110(1)–110(n) (collectively, "memory devices 110") and a memory controller 120 are arrayed. Memory devices 110(1)–110(n) may be, for example, RDRAM devices designed by Rambus Corporation. Signal traces 130 couple memory devices 110 to memory controller 120. In order to minimize signal transit time, signal traces 130 are routed between memory devices 110 and memory controller 120 as directly as possible. In addition, high frequency signals on signal lines 130 are isolated from each other by interposed reference traces 140. Reference traces 140 are shown darker in FIG. 1 to distinguish them from signal traces 130, not to indicate their relative size, physical properties, etc.

Reference traces 140 serve as AC grounds to isolate high frequency signals on signal traces 130. Reference traces 140 are coupled to a DC reference potential that is typically provided through a voltage plane or layer (FIG. 2) within circuit board 100.

Figure 2:
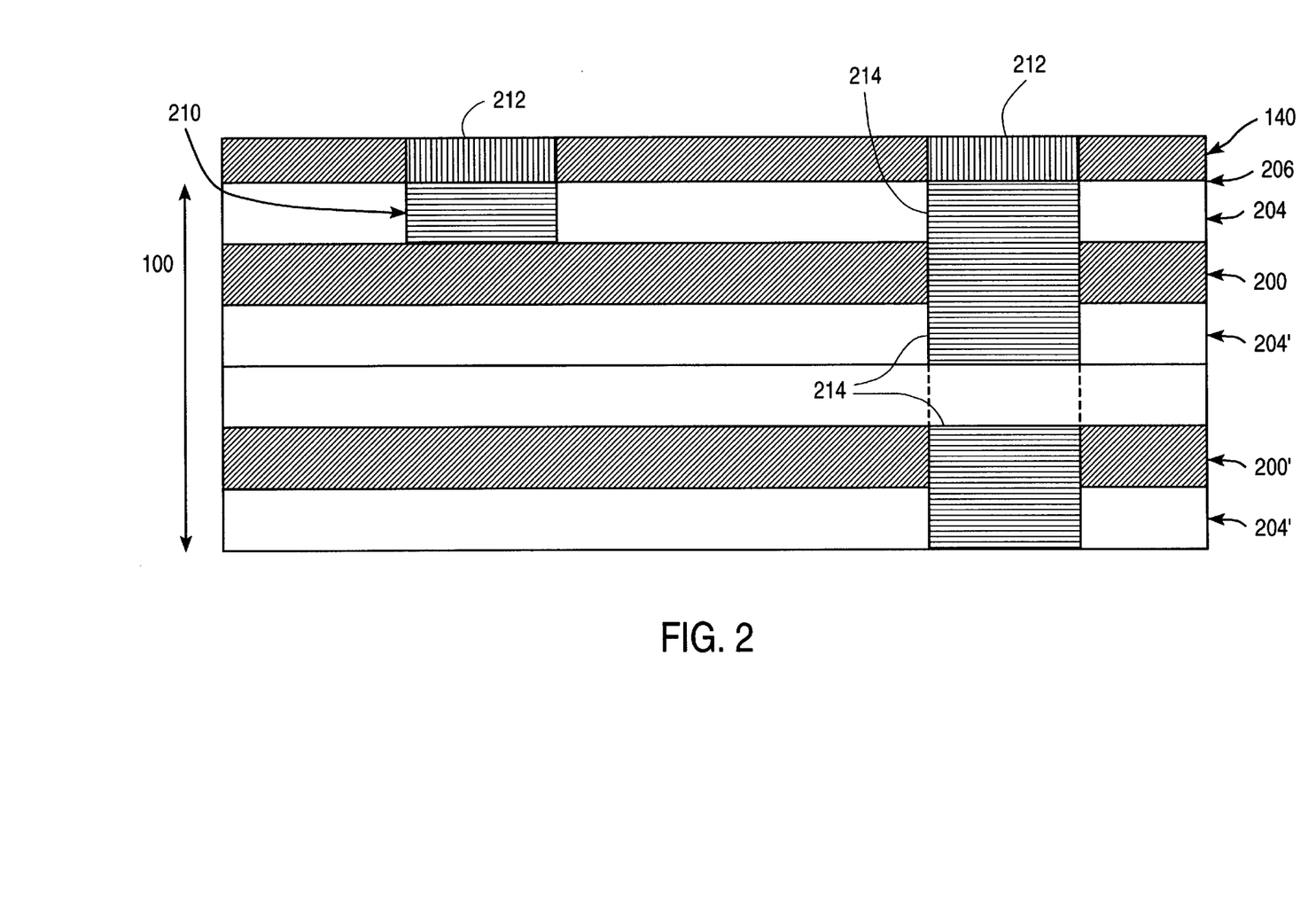
FIG. 2 is a cross-sectional view of the circuit board of FIG. 1.

Referring now to FIG. 2, there is shown a cross-section of circuit board 100 indicating the relationships among a voltage plane 200, via 210, and reference trace 140. Circuit board 100 comprises one or more layers of substrate 204 and one or more voltage plane(s) 200. Substrate 204 electrically isolates voltage plane 200 from reference traces 140 and signal traces 130 (FIG. 1) located on a surface 206 of substrate 204. Where multiple voltage planes 200, 200' are present, additional layers of substrate 204 electrically isolate voltage planes 200, 200' from each other.

The potential at voltage plane 200 is coupled to reference trace 140 through vias 210, 214. Here, via refers to the conductive plug that connects voltage plane 200 and reference trace 140 through substrate 204. Via 210 is an example of a blind via, while via 214 is an example of a plated through hole (PTH) via. PTH vias 214 are easier to manufacture, and consequently their use is more prevalent in circuit boards 100. However, the present invention does not require a particular type of via for proper operation. Via pads 212 are structures at surface 206 that couple vias 210, 214 to reference trace 140. Voltage plane 200 is typically held at DC potential such as ground. Where multiple voltage planes 200 are present, DC potentials in addition to ground may be provided. For example, a second voltage plane 200' may provide a voltage relative to ground that is suitable for powering devices mounted on circuit board 100.

Figure 3A:
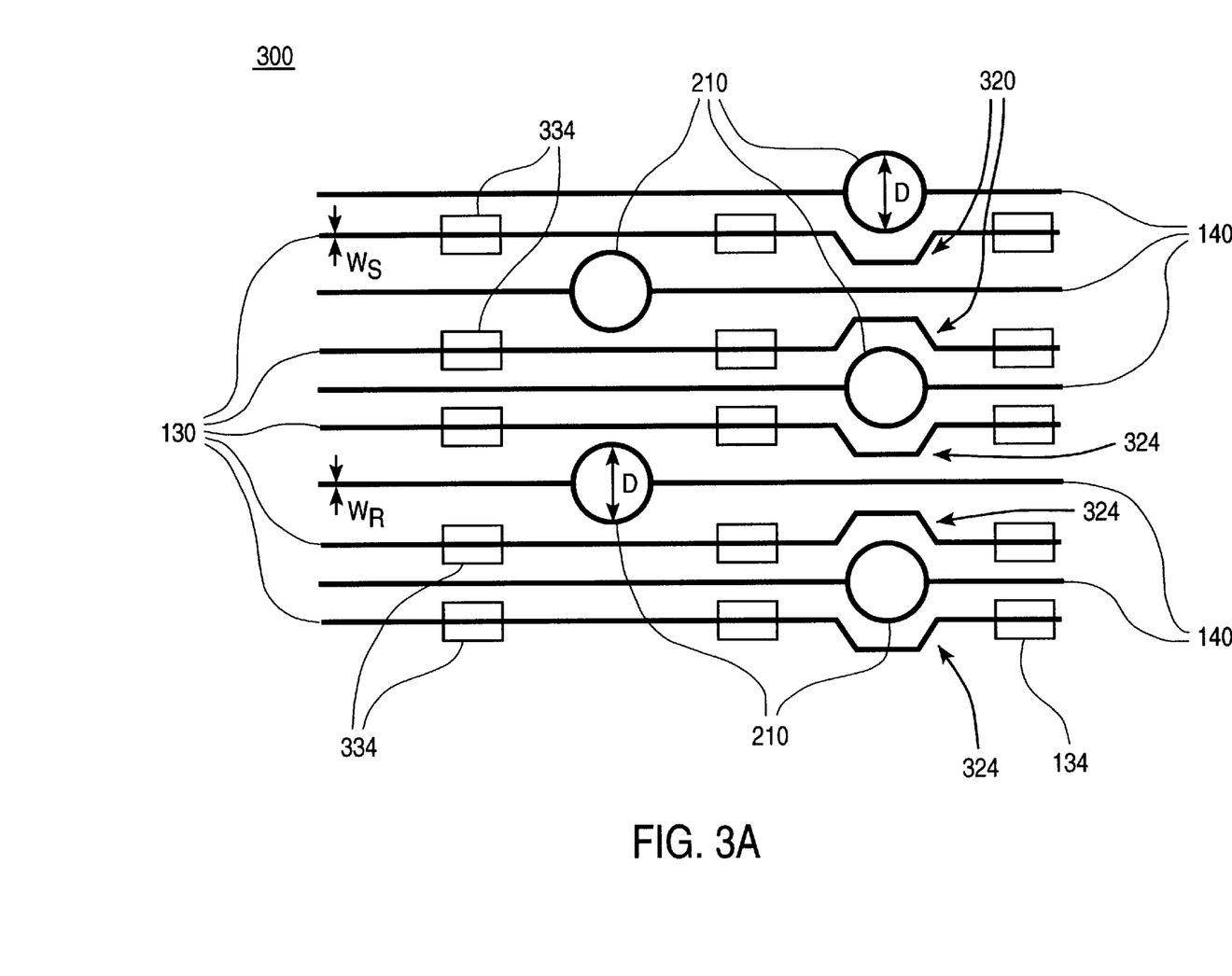
FIG. 3A is a diagram of an unmodified connector for coupling high frequency signals between the memory cells and memory controller of FIG. 1.

Referring now to FIG. 3A, there is shown a detailed view of an unmodified connector 300 for coupling RDRAMs 110 to memory controller 120. Signal traces 130 alternate with reference traces 140, and each reference trace 140 is coupled to one or more vias 210 to provide electrical continuity with voltage plane 200 (FIG. 2). Vias 210 typically have relatively large diameters to facilitate circuit board manufacture and provide a high conductivity path between reference plane 200 (FIG. 2) and reference lines 140. In the disclosed connector 300, the diameters D of vias 210 are substantially larger than the widths $W_R$ of reference traces 140. In many cases, via diameters D are also larger than the widths $W_S$ of signal traces 130.

For the reasons noted above, signal traces 130 are closely configured with reference traces 140 and their associated vias 210, forcing signal traces 130 to be routed around vias 210 as indicated. This routing introduces bends 320 in signal traces 130 that alter the distance between a signal trace 130 and adjacent reference traces 140. In addition, device pads 334 for coupling signals between devices, e.g. RDRAMs, and signal traces 130 alter the separation between signal and reference traces 130, 140, respectively, in their vicinity. The varying inter-trace separation changes the capacitance and inductance of the signal traces and, consequently, the impedance seen by a signal transmitted on signal trace 130. The non-uniform impedance of signal traces 130 can scatter high frequency signals, and the resulting interference between scattered and unscattered signals generates noise on signal trace 130.

Figure 3B:
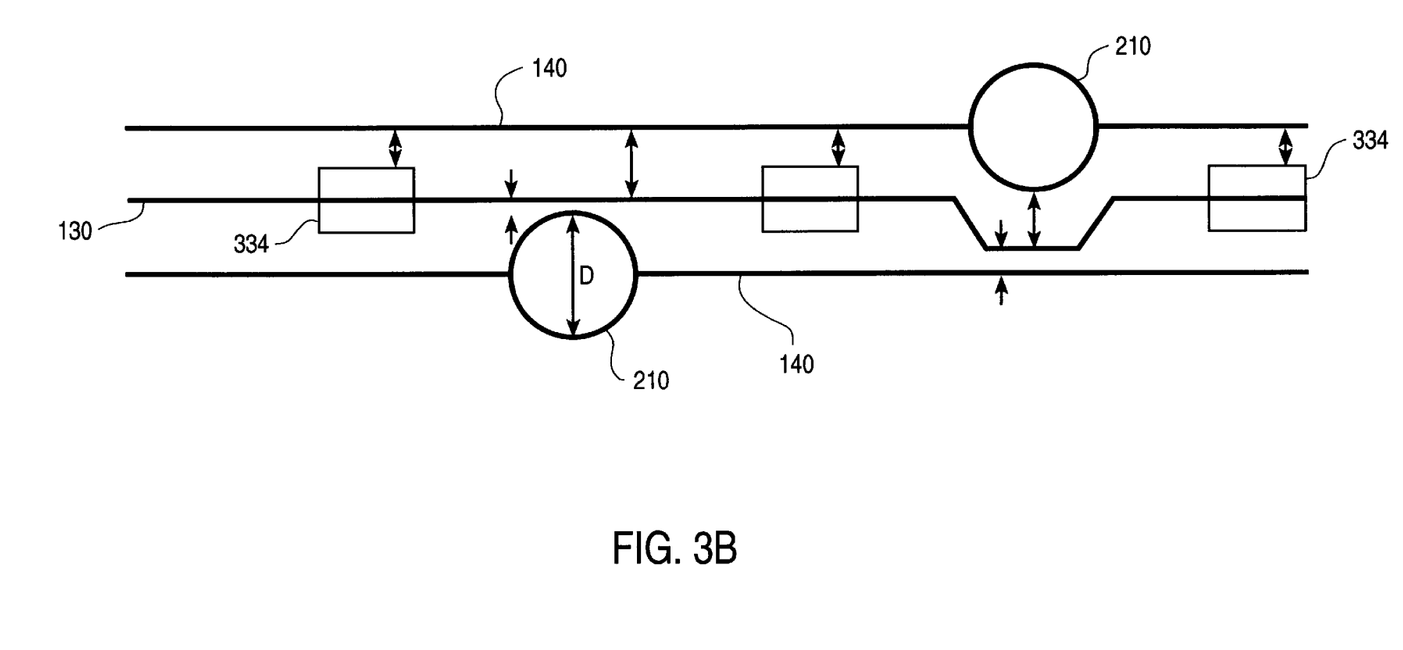
FIG. 3B is an expanded view of a signal trace and its adjacent reference traces from the connector of FIG. 3A.

Referring now to FIG. 3B, there is shown an expanded view of a signal trace 130 and reference traces 140 adjacent to it. Arrows indicate those locations along signal trace 130 where its impedance is modified by the changing separation from reference traces 140 by, for example, via pads 212 and device pads 334. Each impedance modification can scatter signals propagating on signal trace 130. The number of modifications can generate unacceptable noise levels in signals transmitted on signal trace 130.

Figure 4A:
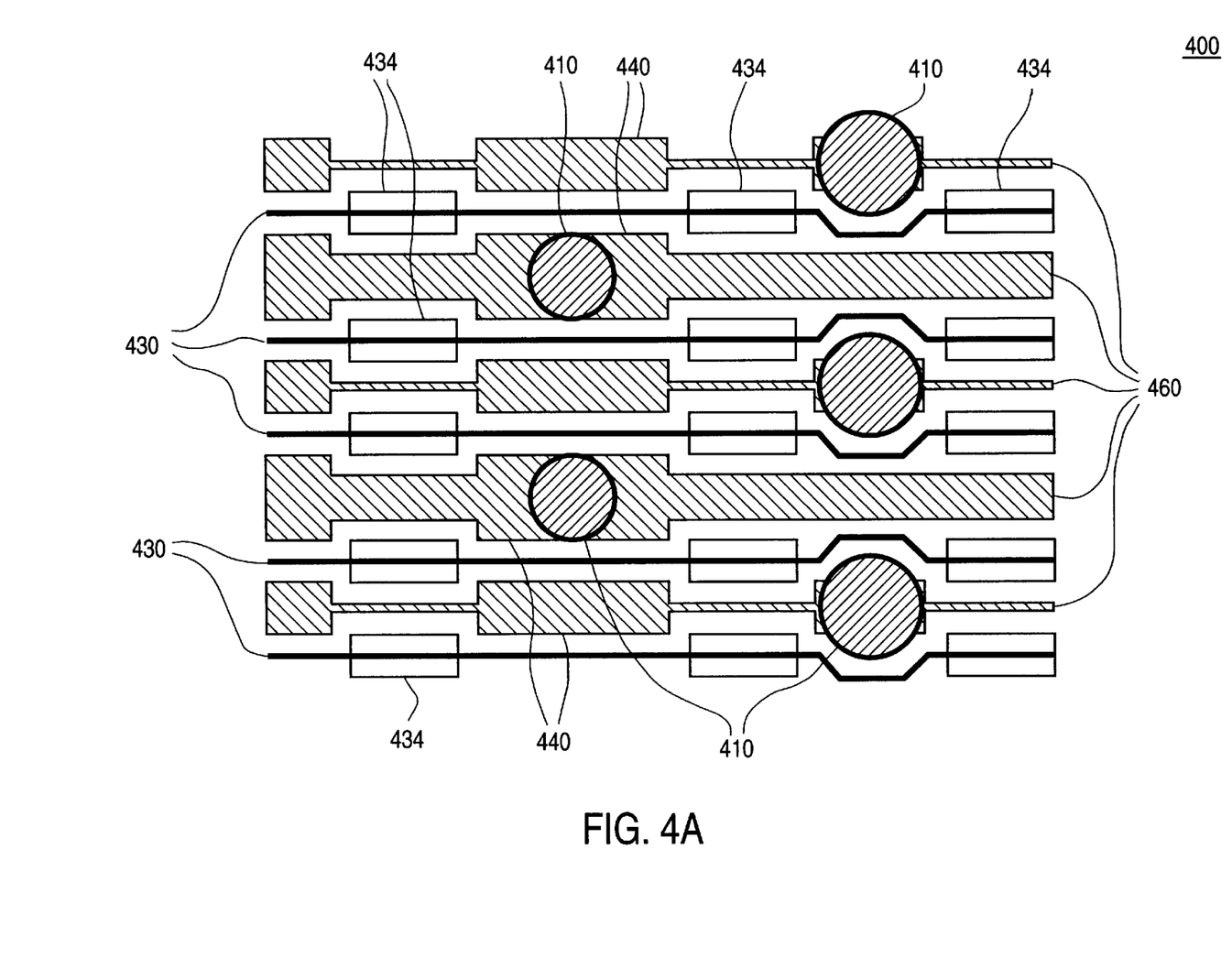
FIG. 4A is a diagram of a high frequency signal connector in accordance with the present invention.

Referring now to FIG. 4A, there is shown one embodiment of a high speed signal connector 400 in accordance with the present invention. Connector 400 includes signal traces 430 that are coupled to device pads 434 and reference traces 440 that are coupled to a reference voltage plane (not shown) through a via pad 412 and its associated via (not shown). Each reference trace 440 and its associated via pad 412 form a reference structure 460 at the reference voltage determined by the voltage plane to which it is coupled. Reference structures 460 extend along signal traces 430 between devices at locations indicated by device pads 434 to reduce capacitive coupling between signal traces 430.

In one embodiment of the present invention, the width of each reference structure 460 is modified to maintain a relatively constant separation from adjacent signal traces 430. For example, width 442 (FIG. 4B) of reference structure 460 is reduced where reference structure 460 is adjacent to a device pad 434 of signal trace 430, while width 444 (FIG. 4B) of reference structure 460 is increased where reference structure 460 is adjacent to a section of signal trace 430 without a signal trace.

As can be seen in FIG. 4A, the inter-trace separation is not constant along the entire length of connector 400. For example, it is difficult to maintain a constant separation between device pad 434 and reference structure 460 at the corners of device pad 434. Similarly difficulties arise at the corners of sections 440 of reference structure 460. To the extent that these structures are modified to reduce the effects of their corners, the inter-trace separation can be maintained more nearly constant. Selected modifications are discussed in greater detail below.

It is expected that the additional benefits gained by further refining these structures to closer approximate a constant separation will decrease as refinements become smaller. At some level of refinement, the advantages are likely to be outweighed by increases in the complexity of the processing and the time required to process these structures. In this regard, a substantially constant separation between a signal trace 120 and adjacent reference structures 130 includes modifications to signal trace 120 and/or its adjacent reference structures 130 that reduce impedance variations relative to those present in the connectors of FIGS. 3A, 3B.

Figure 4B:
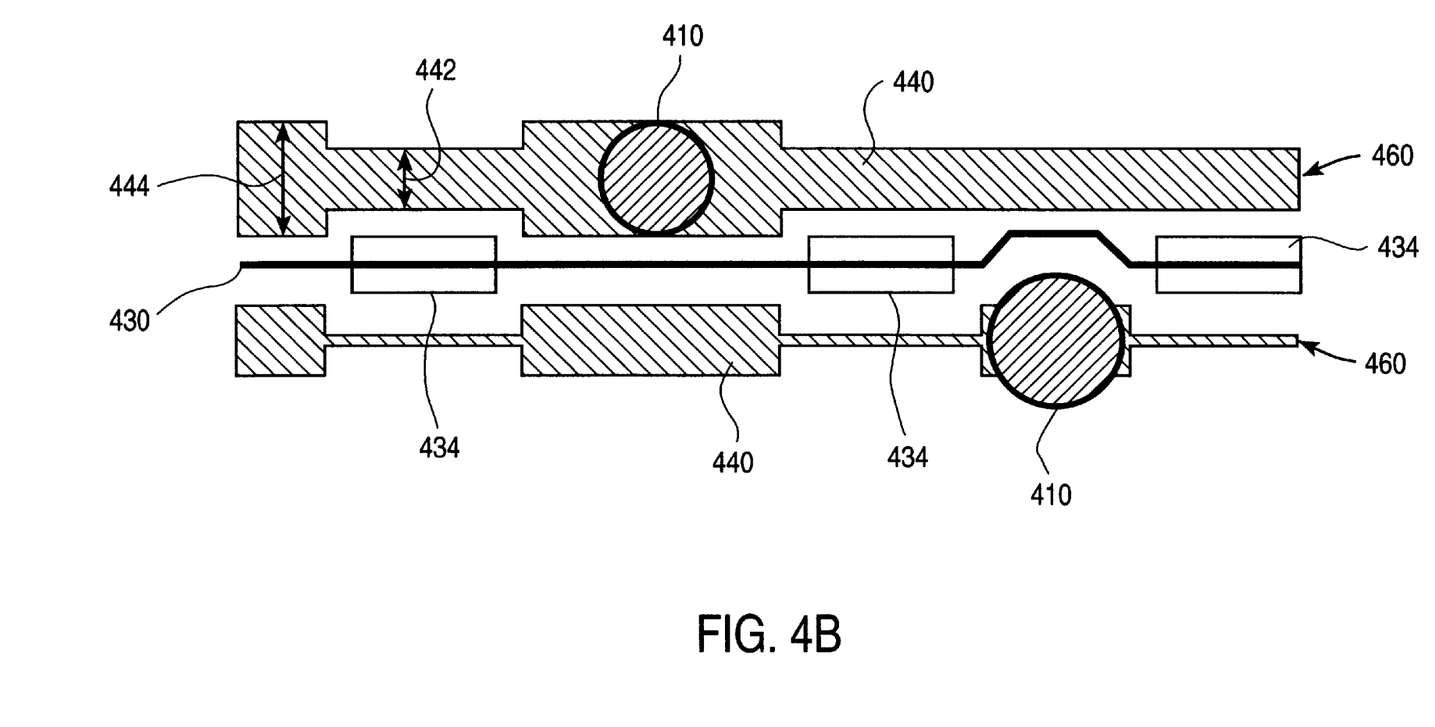
FIG. 4B is an expanded view of a signal trace and its adjacent reference structures for the connector of FIG. 4A.

Referring now to FIG. 4B, there is shown an expanded view of signal trace 430 and adjacent reference structures 460 of FIG. 4A. The separations between signal trace 430 and reference structures 460 are indicated by double ended arrows. It is apparent from FIG. 4B that non-uniformities in the impedance of signal trace 430 attributable to changes in the capacitive coupling to reference structures 460 are mitigated by the varying widths of reference structures 460.

It is also recognized that impedance non-uniformities in signal trace 430 may be mitigated by varying the composition of signal trace 430 and/or reference structure 460 along their lengths. It is expected that the complex processing required to alter trace compositions limits the applicability of this approach.

Figure 4C:
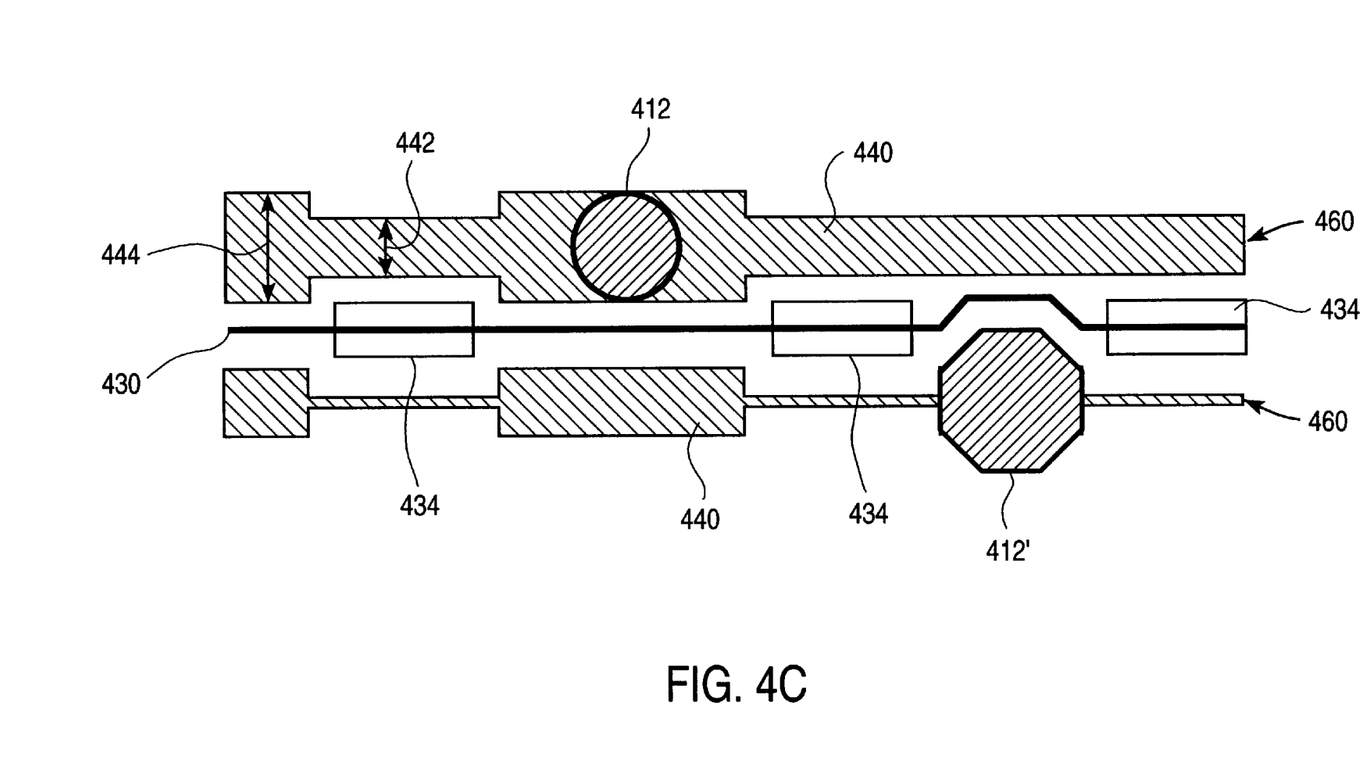
FIG. 4C shows an alternative embodiment of the connector of FIG. 4A.

Referring now to FIG. 4C, there is shown a further refinement to connector 400 of FIG. 4A. In this embodiment, a via pad 412 has been modified so that its shape more nearly tracks that of signal trace 430 in the region adjacent to signal trace 430. In the disclosed embodiment, via pad 412 has an octogonal cross-section which may be created by well-known manufacturing methods. It is understood that while the shape of via pad 412 may be adjusted to better maintain the separation between trace 430 and reference structure 460, the underlying via that couples via pad 412 to voltage plane 200, 200' preferably retains its circular cross sections.

Embodiments of connector 400 suitable for use with devices 110 of FIG. 1 typically employ signal traces 430 and references traces 440 that have widths on the order of thousandths of an inch ("mils"). These widths reflect the close packing necessary to accommodate the size and configuration of devices 110 on circuit board 100 (FIG. 2). In one such embodiment, the width of reference traces 440 is between approximately 1 and 10 mils and typically on the order of 5 mils. The width of signal traces 430 is typically selected from the range of approximately 5 to 30 mils. Different widths may be employed for signal and reference traces 430, 440 depending on the application for which connector 400 is used. For example, the impedance of signal trace 430 is governed by a number of factors, including its width and composition, its spatial relationships with reference structure(s) 460 and reference plane 200 (FIG. 2), and the composition of substrate 204. Accordingly, different widths may be suitable for signal and reference traces 430, 440, respectively, depending on these other factors.

There has thus been provided a connector for coupling high frequency signals between devices where timing and device constraints require tightly configured signal traces. The signal traces alternate with reference structures, each of which includes a reference trace and one or more vias that hold the reference structure at a constant voltage. The via(s) couples the reference structure to a voltage plane. The width of the reference structure is modified to maintain a relatively constant separation between each signal trace and its adjacent reference structure(s).

What is claimed is:

1. A connector comprising:
    a plurality of reference vias forming an array on a substrate surface each reference via to provide a reference voltage at the surface;
    a plurality of signal traces, each signal trace having a substantially constant width to couple a signal between a pair of device pads, each signal trace being routed around any reference via of the plurality of reference vias that impinges on a direct path between the pair of device pads; and
    a plurality of reference voltage traces alternating with the plurality of signal traces and coupled to the reference vias to provide an array of voltage reference structures, each of the reference structures having a width that varies to provide a substantially constant separation between each signal trace and each reference voltage structure adjacent to the signal trace.

2. The connector of claim 1, further comprising a voltage layer substantially parallel to the substrate surface and coupled to the reference traces through the plurality of vias to provide the reference potential to the plurality of vias.

3. The connector of claim 1, wherein the width of each reference structure is varied to also maintain a substantially constant distance between the reference structure and the device pad coupled to the adjacent signal trace.

4. A connector comprising:
    an array of reference via pads on a substrate;
    a plurality of signal traces, each signal trace forming a path of substantially uniform width between a pair of device pads, the path being routed to avoid any reference via pads of the array that impinge on a direct line between the device pads; and,
    a plurality of reference traces, each reference trace being coupled to a reference via pad to form a reference structure having a width that varies with the paths of signal traces that are adjacent to the reference structure to maintain a substantially constant separation between the reference structure the signal traces adjacent to the reference structure.

5. The connector of claim 4, wherein the pair of device pads couple a signal between the signal trace and a pair of devices.

6. The connector of claim 5, wherein the width of each reference structure is also varied to maintain a substantially constant separation between the reference trace and the device pads on the adjacent signal traces.

7. The connector of claim 4, wherein each reference via pad is shaped to maintain a substantially constant distance to an adjacent signal trace.

8. A connector for coupling a high frequency signal across a surface of a substrate, the connector comprising:
    first and second reference vias in the substrate having a dimension in a first direction at the substrate surface;
    first and second reference voltage traces coupled to the first and second reference vias, respectively, and extending in a second direction that is substantially perpendicular to the first direction on the substrate surface;
    a signal trace located between the first and second reference voltage traces to couple a signal in the second direction, the signal trace deviating from the second direction near the first and second reference vias, wherein the signal trace has a substantially uniform width along the second direction and the first and second reference voltage traces are narrowed near the second and first reference vias, respectively, to maintain a relatively constant spacing with the signal trace.

9. The connector of claim 8, wherein each of the first and second reference vias includes a via pad for forming an electrical connection with the first and second reference voltage traces, respectively, each via pad being shaped to provide a substantially constant separation between the via pad and a portion of a signal trace adjacent to the via pad.

10. The connector of claim 8, further comprising a voltage layer that is coupled to the first and second voltage reference traces through the first and second vias, respectively, to provide the reference potential to the reference traces.

11. The connector of claim 10, further comprising a device pad associated with the signal trace to couple signals between a device and the signal trace.

12. The connector of claim 11, wherein the first and second reference voltage traces are narrowed near the device pad to maintain a substantially constant distance between the reference voltage trace and the associated device pad.

13. The connector of claim 8, wherein the first and second reference vias are offset along the first direction to relieve congestion between the signal trace and the first and second reference structures.

14. A system comprising:
first and second memory devices affixed to a surface of a connector at first and second locations;
a plurality of reference vias disposed between the first and second locations to provide a reference voltage at the connector surface;
a plurality of pairs of device pads affixed to the connector, each pair to provide electrical connections to the first and second memory devices;
a plurality of signal traces, each signal trace having a substantially constant width and providing an electrical path between a pair of device pads, the electrical path being routed around any of the reference vias that impinge on a direct path between the pair of device pads; and
a plurality of reference traces, each reference trace having a width that is varied to accommodate routing of adjacent signal traces.

15. The system of claim 14, wherein the first and second memory devices are a DRAM device and a memory controller, respectively.

16. The system of claim 15, wherein the DRAM device is a RDRAM device.

17. The system of claim 14, wherein the widths of one or more of the reference traces are also varied to accommodate device pads on one or more adjacent signal traces.

* * * * *

UNITED STATES PATENT AND TRADEMARK OFFICE
CERTIFICATE OF CORRECTION

PATENT NO. : 6,111,205  
DATED : August 29, 2000  
INVENTOR(S) : Leddige et al.

Page 1 of 1

It is certified that error appears in the above-identified patent and that said Letters Patent is hereby corrected as shown below:

Column 4,  
Line 67, delete "comers", insert -- corners --.

Column 5,  
Line 3, delete "comers" insert -- corners --.

Signed and Sealed this

Twenty-first Day of May, 2002

Attest:

JAMES E. ROGAN  
*Attesting Officer*     *Director of the United States Patent and Trademark Office*